United States Patent [19]
McIver et al.

[11] Patent Number: 5,402,003
[45] Date of Patent: Mar. 28, 1995

[54] LOW DIELECTRIC CONSTANT INTERCONNECT FOR MULTICHIP MODULES

[75] Inventors: George W. McIver, Redondo Beach; Paula R. Hurt, Manhattan Beach; John E. Dowsing, III, Redondo Beach, all of Calif.

[73] Assignee: TRW Inc., Redondo Beach, Calif.

[21] Appl. No.: 151,327

[22] Filed: Nov. 12, 1993

[51] Int. Cl.$^6$ .................. H01L 27/10; H01L 27/15
[52] U.S. Cl. .................. 257/668; 257/675; 257/706
[58] Field of Search .......... 257/668, 675, 701, 703, 257/706, 707, 728

[56] References Cited
U.S. PATENT DOCUMENTS
4,256,792  3/1981  Koepke et al. .................. 257/703

FOREIGN PATENT DOCUMENTS
0121374  10/1984  European Pat. Off. ............ 257/706
61-177752  8/1986  Japan .......................... 257/703
63-287042  11/1988  Japan .......................... 257/703
1-33949    2/1989  Japan .......................... 257/701

Primary Examiner—Andrew J. James
Assistant Examiner—Stephen D. Meier

[57] ABSTRACT

A substrate applicable to be used in a multichip module including a plurality of integrated circuits. The substrate includes a series of interrelated metal layers, ceramic layers and lattice structures formed by the ceramic layers. The metal layers provide ground planes, power planes and interconnects for the integrated circuit. The lattice structure consists of a series of ceramic regions separating the ceramic layers such that the majority of the lattice structure is air in order to reduce the effective dielectric constant of the substrate.

16 Claims, 1 Drawing Sheet

LOW DIELECTRIC CONSTANT INTERCONNECT FOR MULTICHIP MODULES

BACKGROUND OF THE INVENTION

1. Field of the Invention

This invention relates generally to a substrate having a reduced dielectric constant and, more particularly, to a substrate having a reduced dielectric constant for use in multichip modules in which the substrate includes a series of spaced apart ceramic layers defining lattice structures therebetween for trapping air.

2. Discussion of the Related Art

As is well understood, techniques for fabricating integrated circuits allows a very large number of integrated circuit chips to be arranged and interconnected on a single substrate. Such an arrangement is sometimes referred to as a multichip module (MCM). In most MCMs, the substrate includes several dielectric ceramic layers including deposited metal layers for supporting and connecting associated integrated circuit chips in which the entire assembly is configured within a ceramic or metal housing. In certain applications, the substrate makes up the floor of the housing. Ceramic is selected as the dielectric material in many reliability applications because of the ability of this type of material to provide a hermetic seal, and thus protect the integrated circuits.

Two well known processes of fabricating an MCM substrate of this type are referred to as low temperature cofired ceramic (LTCC) and high temperature cofired ceramic (HTCC), both of which begin as layers of green (or unfired) tape. In the substrate fabrication processes, green unfired ceramic layers are first provided in a rolled strip format. Depending on the requirements of a particular MCM being developed, the strips of ceramic are punched to form desirable recesses and vias to accommodate the integrated circuit chips themselves, as well as the interconnects between the chips and any other associated circuitry. Metal layers are deposited and patterned on the ceramic layers in order to provide necessary ground planes, power planes and interconnects between the chips. Once the holes in the ceramic layers and the metal layers are formed, the different layers are stacked relative to each other such that the holes and recesses are appropriately aligned. The number of ceramic layers and metal layers is determined by the specific application and the number of integrated circuit chips. The layers are then fired at either low temperature for the LTCC process or high temperature for the HTCC process to form a single substrate or integral package.

Ceramic has a relatively high dielectric constant. Because of this high dielectric constant, a significant increase in the capacitive loading of the interconnect nodes between the integrated circuit chips in an MCM occurs, especially since several layers of ceramic are present. Capacitive loading degrades frequency performance and increases power dissipation in the MCM. Additionally, a higher dielectric constant lowers the attainable characteristic impedance for many microwave applications. In these microwave applications, a secondary effect of increasing series resistive losses occurs for the interconnects due to smaller conductive cross sections. Therefore, the use of ceramic substrates in multichip modules has been known to limit the performance of the device at frequencies above a few hundred megahertz. This problem may provide a significant drawback for certain applications such as in military and space electronics.

Low dielectric constant materials, such as certain glasses and Kevlars, used as substrates in these applications is a possible alternative. However, these materials are generally organic in nature, and as such provide certain inherent reliability problems which may significantly detract from the low dielectric advantages. Consequently, use of these materials may not be desirable.

What is needed is a substrate which provides low capacitance for interconnected paths between integrated circuit chips in a multichip module, provides a hermetic seal for the integrated circuits, and provides good stability and reliability in the multichip module. It is therefore an object of the present invention to provide such a material or structure.

SUMMARY OF THE INVENTION

In accordance with the teaching of the present invention, a substrate is disclosed which is applicable for use in a multichip module, in which the substrate utilizes ceramic material, yet maintains a relatively low dielectric constant. In particular, the substrate is a layered structure in which several integrated circuit chips can be interconnected in association with the structure. A series of lattice structures are included as part of the substrate in which the lattice structures are defined by solid outer layers of a ceramic material separating a middle layer in which the middle layer includes relatively large open regions separated by smaller ceramic regions. The solid outer layers are preferably much thinner than the middle layer. Appropriate metal layers and interconnects are deposited and patterned on the solid layers opposite to the middle layer.

Additional objects, advantages, and features of the present invention will become apparent from the following description and appended claims taken in conjunction with the accompanying drawings.

DETAILED DESCRIPTION OF THE PREFERRED EMBODIMENTS

The following discussion of the preferred embodiments concerning a substrate for a multichip module is merely exemplary in nature and is in no way intended to limit the invention or its application or uses.

Figure 1:
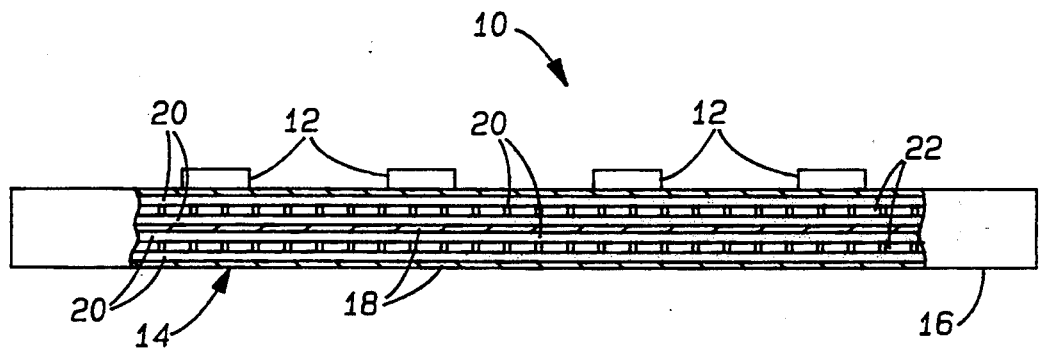
FIG. 1 is a cross sectional cut-away view of an MCM including a substrate according to a preferred embodiment of the present invention.

Turning to FIG. 1, a cross sectional cutaway view of a multichip module (MCM) 10 is shown. The MCM 10 includes several integrated circuit chips 12 configured on and interconnected throughout a substrate 14, according to a preferred embodiment of the present invention. The MCM 10, and associated integrated circuit chips 12 and the substrate 14, are configured within a hermetically sealed, ceramic housing 16. The MCM 10 is shown in a cutaway format to expose the different layers of the substrate 14.

As is apparent from viewing FIG. 1, the substrate 14 includes a series of stacked layers. In particular, a plurality of metal layers 18, solid ceramic layers 20 and lattice structure layers 22 are shown. The metal layers 18 are deposited and patterned on the ceramic layers 20 opposite to the lattice structure layers 22 so as to provide power and ground planes to the different circuits associated with the integrated circuit chips 12. The metal layers 18 are also patterned to provide interconnects between the integrated circuit chips 12. The ceramic layers 20 define the lattice structure layers 22. The solid ceramic layers 20 and the lattice structure layers 22 form dielectric insulative layers separating the metal layers 18.

As noted above, the ceramic material forming the ceramic layers 20 is selected because of the dielectric qualities of ceramic and the ability of metalized ceramic to provide a hermetic seal. However, ceramic has a relatively high dielectric constant, typically on the order of about five for LTCC and ten for HTCC. Because of this relatively high dielectric constant as compared to the conductive portions of the substrate 14, a parasitic capacitance is placed on the interconnects between the different integrated circuit chips 12 which affects the performance of these circuits. By incorporating the lattice structure layers 22, the overall capacitance of the substrate 14 can be reduced as a result of the introduction of a substantial amount of air into the substrate 14. This is because the dielectric constant of air is one, and thus the effective dielectric constant of the substrate 14 is reduced.

The substrate 14 as just described can be manufactured in the same manner as the prior art substrates for multichip modules. That is, the steps which go into the manufacture of the prior art substrates can be used in the substrate according to the invention. When the different ceramic layers are being punched in order to provide vias and recesses to accept the integrated circuits and associated interconnects, dielectric layers can be punched in order to provide the lattice structure layers 22. The ceramic layers forming the lattice structure layers 22 are punched in a manner which significantly eliminates dielectric material, as opposed to providing punched out areas for integrated circuits and interconnects.

In a preferred embodiment, the combination of a lattice structure layer 22 and two adjoining ceramic layers 20 is meant to replace one ceramic layer in the prior art. The ceramic layers 20 can be made thinner, typically on the order of 1–2 mils, than their prior art counterpart. The lattice structure layers 22 could reasonably be between one and ten mils thick. Therefore, the overall thickness and support properties of the substrate 14 is comparable with the prior art substrate, but the overall dielectric constant can be reduced.

Figure 2:
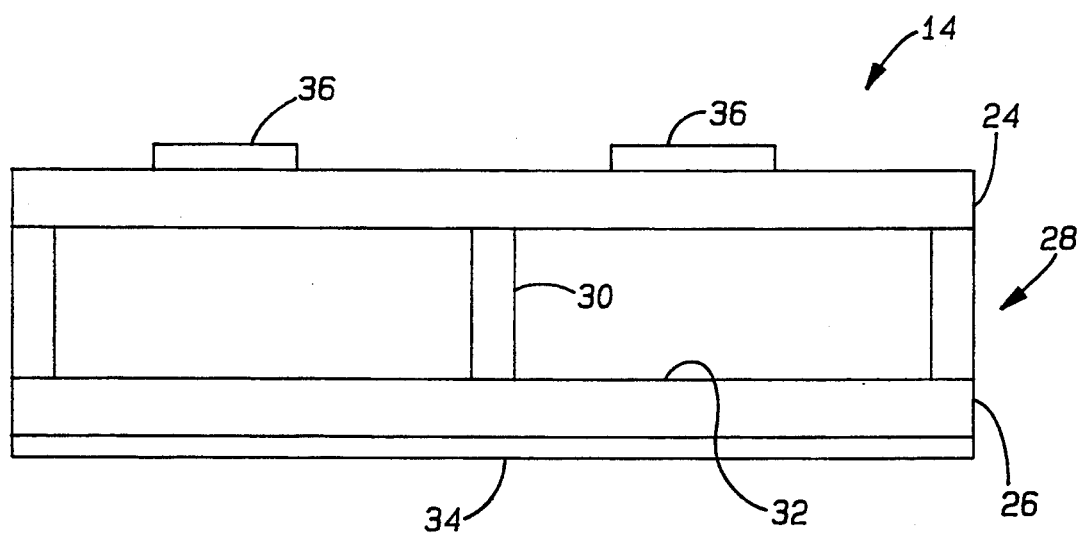
FIG. 2 is a cut-away view of a section of the substrate of FIG. 1.

FIG. 2 shows a cross sectional view of a section of the substrate 14 in order to highlight the metal layers 18, the ceramic layers 20 and lattice structure layers 22. An upper dielectric layer 24 and a lower dielectric layer 26 are shown as being representative of two dielectric layers 20. A lattice structure 28 is formed between the dielectric layers 24 and 26 as representative of a lattice structure layer 22. The lattice structure 28 includes a series of ceramic regions 30, here three, which define air gaps 32 formed between the layers 24 and 26 and the ceramic regions 30. In this manner, most of the area of the lattice structure 28 is air. In a preferred embodiment, the outer layers 24 and 26 are much thinner as compared to the distance between them.

A ground plane or power plane 34 as representative of a metal layer 18 is deposited on a surface of the lower dielectric layer 26 opposite to the lattice structure 28. A series of top metal interconnects 36 are deposited and patterned on a surface of the upper dielectric layer 24 opposite to the lattice structure 28. These metal contacts provide conductive interconnects between the integrated circuit chips 12 which are supported on the substrate 14.

The effective dielectric constant of the substrate 14 can be calculated as follows. In this example, the upper dielectric layer 24 is denoted by the subscript (1), the lattice structure 28 is denoted by the subscript (2), and the lower dielectric layer 26 is denoted by the subscript (3). Additionally, the thickness and the dielectric constant of the individual layers are T and $\epsilon$, respectively. The effective dielectric constant ($\epsilon_{eff}$) of the substrate 14 is then given by:

$$\epsilon_{eff} = \frac{(T_1 + T_2 + T_3)}{T_1/\epsilon_1 + T_2/\epsilon_2 + T_3/\epsilon_3}$$

If the lattice structure 28 has a dielectric constant of approximately one (1), as a result of it being mostly air, and the outer dielectric layers 24 and 26 have a typical dielectric constant of a ceramic material of approximately 10, then the above equation reduces to:

$$\epsilon_{eff} = \frac{(T_1 + T_2 + T_3)}{T_2}$$

Therefore, $\epsilon_{eff}=3$ if all of the layers have an equal thickness. If the lattice structure 28 is twice as thick as the layers 24 and 26, then $\epsilon_{eff}=2$.

The effective dielectric constant goes to the value of the ceramic in those areas where the ceramic regions 30 cross the lattice structure 28. Therefore, a desirable enhancement would be to pattern the lattice structure 28 and interconnect patterns to minimize such crossovers. Of course the amount of air as defined by the spacing of the ceramic regions 30 and the thickness of the dielectric layers 24 and 26 is limited by the practicalities and support requirements of the system.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A substrate for supporting at least one integrated circuit, said substrate comprising:
   an upper dielectric layer;
   a lower dielectric layer; and
   a lattice structure positioned between the upper dielectric layer and the lower dielectric layer, said lattice structure including a plurality of dielectric regions in contact with and separating the upper dielectric layer and the lower dielectric layer so as to form air gaps between the upper dielectric layer and the lower dielectric layer, said dielectric regions having dimensions such that the majority of the lattice structure is air.

2. The substrate according to claim 1 wherein the upper dielectric layer and lower dielectric layer are thin as compared to the distance separating them by the lattice structure.

3. The substrate according to claim 1 wherein the upper dielectric layer, the lower dielectric layer and the dielectric regions are made of a ceramic material.

4. The substrate according to claim 1 further comprising at least one metal layer, said metal layer being deposited on at least one of the upper dielectric layer or the lower dielectric layer opposite to the dielectric regions.

5. The substrate according to claim 4 wherein the substrate includes a plurality of lattice structures being separated by upper and lower dielectric layers therefore, and wherein a plurality of metal layers are deposited and patterned on the upper and lower dielectric layers in order to provide ground planes, power planes, and interconnects for integrated circuits supported on the substrate.

6. The substrate according to claim 1 wherein the upper and lower dielectric layers have a thickness between about 1-2 mils, and the lattice structure has a thickness between about 4-8 mils.

7. A substrate applicable to support a plurality of integrated circuits associated with a multichip module, said substrate comprising:
a series of metal layers forming power planes, ground planes and conductive interconnects between the integrated circuits; and
a series of lattice structures, each of the lattice structures being formed by a first dielectric layer, a second dielectric layer and a middle layer, said middle layer including a series of dielectric regions separating the first and second dielectric layers so as to form air gaps between the first dielectric layer and the second dielectric layer, wherein the majority of the lattice structure is air.

8. The substrate according to claim 7 wherein the first and second dielectric layers are relatively thin as compared to the distance that separates them.

9. The substrate according to claim 7 wherein the dielectric regions are separated from each other and are of such a dimension that substantially all of the lattice structure is air.

10. The substrate according to claim 7 wherein the first and second dielectric layers and the dielectric regions are made of ceramic.

11. The substrate according to claim 7 wherein the substrate forms a wall of a housing in which the multichip module is enclosed.

12. The substrate according to claim 7 wherein the first and second dielectric layers have a thickness between about 1-2 mils, and the lattice structure has a thickness between about 4-8 mils.

13. A substrate used in association with a plurality of integrated circuit chips forming a multichip module, said substrate and associated integrated circuits being included in a single housing, said substrate comprising:
a plurality of metal layers forming ground planes, power planes and conductive interconnects between the integrated circuits; and
a plurality of lattice structures positioned between the metal layers, wherein each lattice structure includes a first ceramic layer adjacent one metal layer and a second ceramic dielectric layer adjacent another metal layer, and a series of ceramic regions separating the first and second ceramic layers in order to define air gaps between the first and second dielectric layers.

14. The substrate according to claim 13 wherein the first and second dielectric layer are thin as compared to the distance that separates them, and the ceramic regions are separated and of such dimension that the lattice structure is mostly air.

15. The substrate according to claim 13 wherein the substrate forms a bottom portion of the housing, said housing being made of a ceramic material.

16. The substrate according to claim 13 wherein the first and second dielectric layers have a thickness between about 1-2 mils, and the lattice structure has a thickness between about 4-8 mils.

* * * * *